United States Patent
Sasaki et al.

(10) Patent No.: US 6,297,965 B1
(45) Date of Patent: Oct. 2, 2001

(54) WIRING ARRANGEMENT INCLUDING CAPACITORS FOR SUPPRESSING ELECTROMAGNETIC WAVE RADIATION FROM A PRINTED CIRCUIT BOARD

(75) Inventors: Hideki Sasaki; Takashi Harada, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/340,053

(22) Filed: Jun. 28, 1999

(30) Foreign Application Priority Data

Jun. 30, 1998 (JP) .................................. 10/184469

(51) Int. Cl.[7] ................................ H05K 7/02; H05K 7/06
(52) U.S. Cl. .................... 361/782; 361/760; 361/777; 361/780; 361/794; 361/818; 333/12; 333/247; 307/89; 307/91
(58) Field of Search ....................... 361/760, 777, 361/780, 782, 783, 794, 818, 763, 793; 174/250, 261, 262; 333/12, 247; 307/89, 91

(56) References Cited

U.S. PATENT DOCUMENTS 5,068,631 * 11/1991 Vince ...................................... 333/12
6,075,211 * 6/2000 Tohya et al. ......................... 361/794
6,084,779 * 7/2000 Fang ..................................... 361/794
6,111,479 * 8/2000 Myohga et al. ..................... 361/780
6,166,457 * 12/2000 Iguchi et al. .......................... 307/91

FOREIGN PATENT DOCUMENTS

| 6-244562 | 9/1994 | (JP) . |
| 7-46748 | 5/1995 | (JP) . |
| 9-205290 | 8/1997 | (JP) . |
| 9-283974 | 10/1997 | (JP) . |
| 10-112574 | 4/1998 | (JP) . |

* cited by examiner

Primary Examiner—Jeffrey Gaffin
Assistant Examiner—John B. Vigushin
(74) Attorney, Agent, or Firm—McGuire Woods LLP

(57) ABSTRACT

Disclosed herein is a printed circuit board comprising a ground layer and a signal layer in which the characteristic impedance of a specific source line is made to be not less than three times as large as the impedance at an upper limit frequency at which the electromagnetic wave radiation of a specific capacitor may occur. In this printed circuit board, variation of a power source voltage and unnecessary electromagnetic wave radiation can be suppressed.

7 Claims, 15 Drawing Sheets

MOUNTING A

MOUNTING B

MOUNTING C

WIRING ARRANGEMENT INCLUDING CAPACITORS FOR SUPPRESSING ELECTROMAGNETIC WAVE RADIATION FROM A PRINTED CIRCUIT BOARD

BACKGROUND OF THE INVENTION (a) Field of the Invention

The present invention relates to a printed circuit board constituting a part of an electronic device, more in particular, to the printed circuit board for suppressing unnecessary electromagnetic waves radiated therefrom.

(b) Description of the Related Art

With the demand of high speed operation and high integration of electronic devices, unnecessary electromagnetic wave radiation occurs from a device of which a function is not to radiate the electromagnetic waves, to raise public concern. Therefore, the unnecessary electromagnetic waves, especially those of 30 MHz to 1 GHz, must be legally controlled. Manufacturers of the electronic devices are requested to design and manufacture articles satisfying this legal standard.

In order to suppress the unnecessary electromagnetic wave radiation from the electronic devices, it is most effective that the radiation is suppressed at a printed circuit board in the device. Conventionally, a number of printed circuit boards have been devised having a means for radiation-control.

Examples of these printed circuit boards include that described in JP-A-06(1994)-244562, a circuit board having a low EMI structure disclosed in JP-A-09(1997)-205290, a low EMI multi-layered circuit board described in JP-A-09 (1997)-283974, and electronic devices employing these printed circuit boards.

The characteristic features of these prior arts will be described referring to FIGS. 1 to 3.

In the printed circuit board shown in FIG. 1 which is disclosed in JP-A-06(1994)-244562, a part 131 of a power source layer 133 is separated from the remaining part, and is located on a substrate 134 near a ground layer 132. The power source layer 133 and the separated part (power source layer) 131 are connected by a coupling means 135 to increase an electrostatic capacity between the separated power source layer and the ground layer.

In the circuit board having the low EMI structure shown in FIG. 2 which is described in JP-A-09(1997)-205290, a printed circuit board 150 having a power source layer 151 on one surface and a ground layer 152 on the other surface is illustrated. Minute conductive patterns 154, 155 and minute conductive patterns 153, 156 are alternately disposed on the peripheries of the one layer and of the other layer, respectively. Every other conductive pattern 154 disposed on the periphery of the power source layer 151 is connected with the ground layer 152, and the other every other conductive pattern 155 is connected with the power source layer 151. The every other conductive pattern 153 disposed on the periphery of the ground layer 152 opposing to the above conductive patterns 154 is connected with the power source layer 151, and the every other conductive pattern 156 opposing to the above conductive patterns 155 is connected with the ground layer 152.

In the low EMI multi-layered circuit board shown in FIG. 3 which is described in JP-A-09(1997)-283974, a power source layer 162 and a first ground layer 163 form a capacity C1 interposing a dielectric layer 166, the power source layer 162 and a second ground layer 164 form a capacity C2 interposing a dielectric layer 167, and a resistor 165 is connected between the first ground layer 163 and the second ground layer 164.

In the circuit boards shown in FIGS. 1 to 3, all the circuit boards have a function for suppressing the variation of the power source voltage between the power source layer 162 and the first ground layer 163 both of which are a source of radiation. However, even if the power source layer and a part of the ground planar layer are so disposed that they are close to each other in the printed circuit board shown in FIG. 1, the increase of the electrostatic capacity obtained thereby is extremely small and the sufficient suppression of the power source voltage variation cannot be expected. In the circuit board 150 shown in FIG. 2, the polarities of voltages generated between the conductive patterns 154 and 153 and between the adjacent conductive patterns 155 and 156 are reversed to each other to have a function of implementing the radiation suppression by means of compensating the electric fields at the ends of the circuit board. Since, however, the voltage variation itself between the power source layer 151 and the ground layer 152 is unchanged, the unnecessary electromagnetic wave radiation from these layers 151 and 152 cannot be suppressed. While, in the multi-layered circuit board 161 shown in FIG. 3, the radiation of the unnecessary electromagnetic waves due to the voltage variation between the power source and the ground, and the malfunction of the device can be suppressed, the additional ground layer 164 and the second dielectric layer 167 are required in addition to the ordinary ground layer 163 to make its structure more complicated and to increase the cost.

All the above prior arts unavoidably require large alterations to the board structures. In order to apply the structural alteration to a printed circuit board already supplied as a product, redesign of the circuit board is required from the first step.

On the other hand, in order to suppress the variation of the power source voltage of IC or LSI, a capacitor having a large capacity is conventionally located between a power supply terminal and a ground terminal of IC or LSI. This conventional method utilizes a principle that variation of a power source voltage due to a switching of IC is reduced by making an impedance between a power supply terminal 171 and a ground terminal 172 lower than that of a capacitor ZC as shown in FIG. 4.

However, in a frequency band between 30 MHz and 1 GHz in which the radiation of the unnecessary electromagnetic waves raises the public concern (controlled frequency band), the capacitor element ZC shown in FIG. 4 cannot be regarded as a mere capacitor because of its parasitic inductance. A source line and other capacitors connected to IC are connected between the power supply terminals and the ground terminal of IC in addition to the capacitor element ZC, and the influence of these elements cannot be negligible.

A power supply circuit having a capacitor ZC1, and a source line and a capacitor ZC2 connected thereto is shown in FIG. 5. In order to reduce variation of a power source voltage in this circuit, an input impedance |Zin| observed from IC toward the power supply circuit must be reduced as much as possible. If, for example, a serial circuit including a source line having a length of 200 mm, its characteristic impedance of 50 ohms, its wavelength reduction rate of 0.5 and the capacitors ZC1 and ZC2 having 0.04 ohms, 0.7 nH and 0.1 $\mu$F which are close to those of an actual capacity product is assumed to exist, its input impedance |Zin| becomes that shown as a solid line in FIG. 6. A broken line in FIG. 6 is a frequency characteristic of the absolute value

|ZC| of an impedance of the single capacitor ZC. The impedances |Zin| and |ZC| function as capacitive resistances of which absolute values decrease proportional to wavelengths until about 17 MHz. Since the influence of the parasitic inductance of the capacitor becomes dominant over the above wavelength, the impedances function as an induced reactance in which the absolute value of the impedance increases proportional to the wavelength. Moreover, |Zin| becomes large at specified frequencies by means of the influence of the source line and ZC2. The variation of the power source voltage becomes large when a higher harmonic of an operating wavelength of IC is consistent with a wavelength of the source line and ZC2.

The reason why |Zin| becomes larger is occurrence of parallel resonance of the power supply circuit including the capacitor ZC1, the source line and the capacitor ZC2. Therefore, a large current flows in the source line at a frequency at which the input impedance |Zin| becomes large, and electromagnetic waves radiated therefrom also become large.

A proposal for overcoming the above problem is described in JP-A-10(1998)-112574. In this proposal, four first capacitors for connecting a power source layer and a ground layer disposed on the periphery of a printed circuit board and a second capacitor disposed near IC supplying a transitional current to IC are connected between the power source layer and the ground layer of the .circuit board. However, in this structure, a plurality of the first capacitors must be mounted along the periphery of the circuit board, and when a large circuit board is to be employed, the number of the capacitors required becomes large.

JP-B-07(1995)-46748 also solves a similar problem. In the printed circuit board described therein, a π-type filter consisting of a capacitor, ferrite beads and a capacitor is employed. However, the π-type filter containing the ferrite beads is expensive to invite the cost increase of the printed circuit board.

SUMMARY OF THE INVENTION

It is therefore an object of the present invention to provide a printed circuit board which suppresses radiation of electromagnetic waves by means of suppressing variation of a power source voltage by decreasing an input impedance when a power supply circuit is observed from a point between a power supply terminal of an active element implementing an integrated circuit and a ground terminal. In this instance, only an inexpensive capacitor conventionally employed for suppressing the power source voltage in combination with a source line can provide a printed circuit board for suppressing the variation of the power source voltage and the radiation of the electromagnetic waves without employing an expensive filtering element such as ferrite beads.

The present invention provides a printed circuit board comprising: at least one ground layer; at least one signal layer mounting thereon a plurality of active elements each implementing an integrated circuit having at least one power supply terminal; a common power source line; a plurality of first source lines each disposed for a corresponding one of said active elements, each of said first source lines having a first terminal connected to said power supply terminal of a corresponding one of said active elements and a second terminal connected to said common source line; a first capacitor having a first impedance at a specified frequency specified as an upper limit of a controlled frequency band and connected between said first terminal and said ground layer; and a second capacitor having a second impedance at said specified frequency and connected between said second terminal and said ground layer, said first source line having at said specified frequency a characteristic impedance, which is not lower than three times said first impedance and said second impedance.

The function of the printed circuit board of the present invention will be described referring to FIG. 7 showing an equivalent circuit thereof. In the circuit of FIG. 7, a capacitor ZC3 is made to be located at a length (L) from the capacitor ZC1 in FIG. 5. The input impedance |Zin| observed from IC toward the source line at this moment is shown by a solid line in FIG. 8 in which L is assumed to be 10 mm. The impedance characteristic of ZC1 is shown by a broken line in FIG. 8. While the input impedance |Zin| increases at specified frequencies in the circuit shown in FIG. 5, its peak decreases in the circuit of FIG. 7. Thereby, the suppression of the power source voltage variation due to the switching of IC is expected. Because of the decreased peak, "Q" of the parallel resonance is also expected to decrease to reduce a high frequency current which may be a cause of the electromagnetic wave radiation.

The reason of decreasing the absolute value of the input impedance by adding the capacitor ZC3 will be described referring to FIGS. 7 and 9. In FIG. 9, the absolute value of an input impedance |Zin| observed from IC toward the power supply circuit is shown by a solid line, the absolute value of an input impedance |ZC1| of the capacitor itself is shown by a broken line and the absolute value of an input impedance |Zin2| observed from the capacitor ZC1 toward the power supply circuit is shown by a dotted line. The input impedance Zin appears as that of a parallel circuit of Zin2 and ZC1. When Zin2 is sufficiently larger than ZC1, Zin nearly equals to the impedance of the capacitor ZC1. The parallel resonances of Zin2 between ZC3 and ZC2 occur around 385 MHz and 770 MHz because of the addition of the capacitor ZC3. In this instance, the resonance peak of Zin is decreased because Zin2 becomes sufficiently larger than ZC1.

If, however, the distance (L) between the capacitors ZC1 and ZC3 is too short, the parallel resonance occurs in the power supply circuit because the difference between |Zin2| and |ZC1| becomes too small to satisfy the condition that |Zin2| is sufficiently larger than |ZC1|. The parallel resonance also occurs when the distance (L) is too long. The frequency characteristics of the impedance when a distance (L) equals to 80 mm is shown in FIG. 10. Similarly to FIG. 9, |Zin|, |ZC1| and |Zin2| are shown as a solid line, a broken line and a dotted line, respectively. While |Zin2| functions as an inductive reactance up to about 450 MHz, it functions as a capacitive reactance between about 450 MHz and about 900 MHz. Accordingly, at about 880 MHz, the parallel resonance occurs between |Zin2| functioning as a capacitive reactance and |ZC1| functioning as an inductive reactance to make |Zin| larger. If Zin2 is employed as an inductive reactance up to the upper limit frequency at which the electromagnetic wave radiation may occur, the parallel resonance does not occur. Accordingly, the variation of the power source voltage and the electromagnetic wave radiation can be suppressed by designing the distance (L) between the capacitors ZC1 and ZC3 to that in which the parallel resonance thereof does not occur.

The input impedance of the active element of IC or LSI observed from a point between the power supply terminal and the ground terminal to the power supply circuit may be reduced by employing the way of realizing the printed circuit board of the present invention to suppress the variation of the power source voltage and the electromagnetic radiation.

The above and other objects, features and advantages of the present invention will be more apparent from the following description.

PREFERRED EMBODIMENTS OF THE INVENTION

Now, the present invention is more specifically described with reference to accompanying drawings.

Embodiment 1

Figure 11:
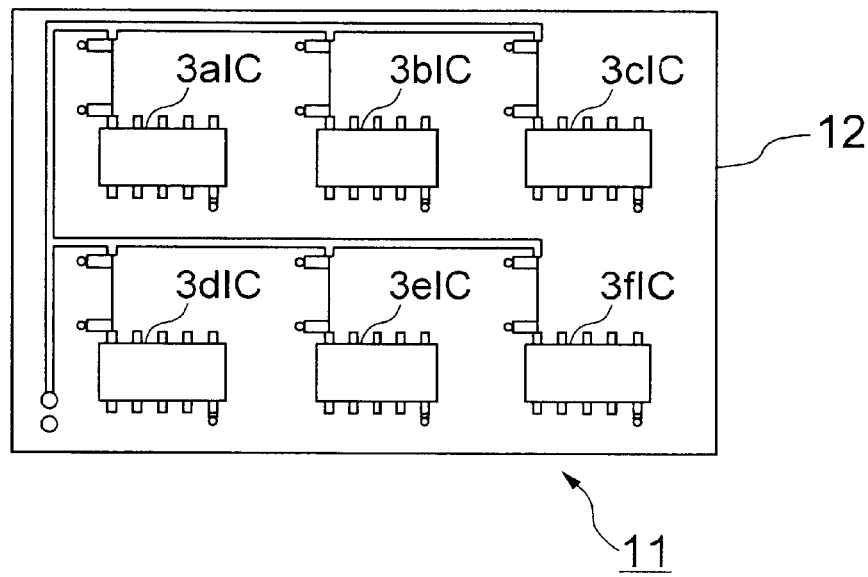
FIG. 11 is a vertical elevational view showing a first embodiment of a printed circuit board in accordance with the present invention.
Figure 12:
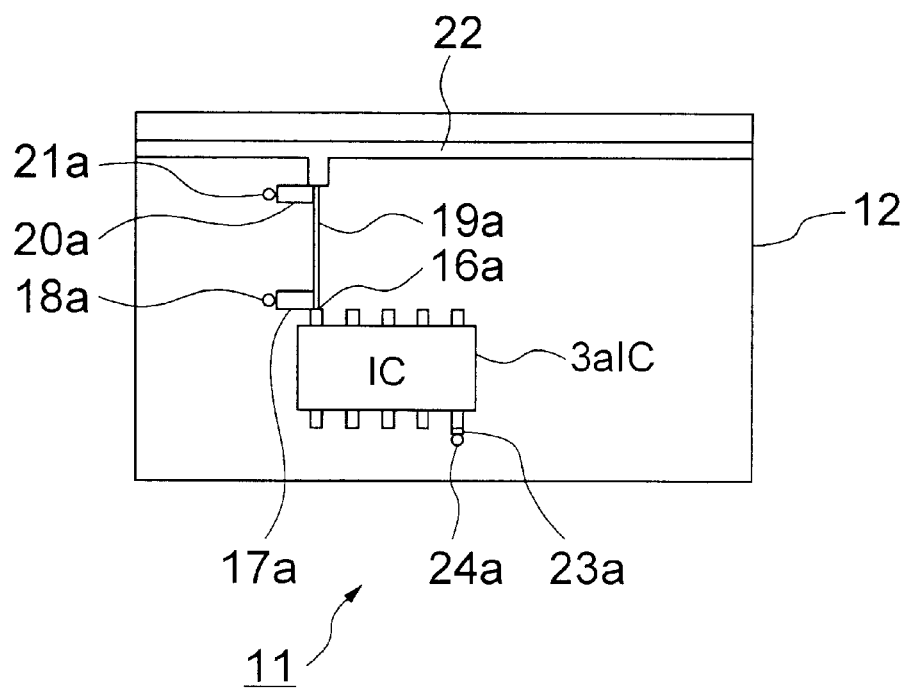
FIG. 12 is an enlarged view of the printed circuit board of FIG. 11 around IC.
Figure 13:
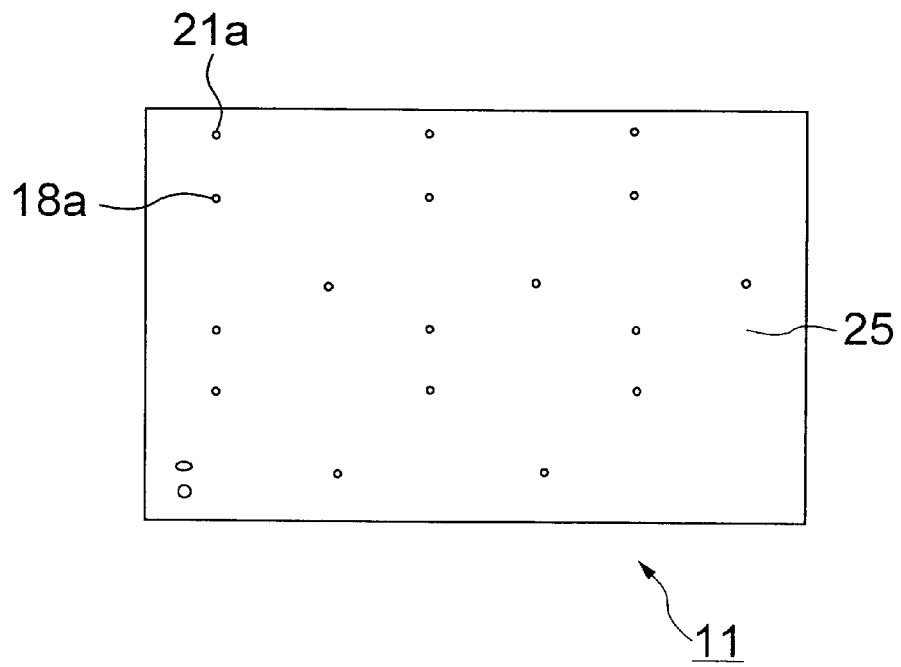
FIG. 13 is a vertical view of one example of a ground layer of the printed circuit board of the present invention.

In FIGS. 11 to 13, a circuit printed board 11 has at least one signal layer 12 and at least one ground layer 25, and the signal layer 12 has several ICs (3a to 3f IC). A capacitor 17a is located near a power supply terminal 16a of the respective ICs.

The capacitor 17a in FIG. 12 has one terminal connected with the power supply terminal 16a and the source line 19a and the other terminal connected with the ground layer 25 through a via hole 18a. Another capacitor 20a is located at the top end of this source line 19a. The capacitor 20 has one terminal connected with the source line 19a and a common source line 22 for supplying power to an active element on the whole board and the other terminal connected with the ground layer 25 through a via hole 21a. A ground terminal 23a of IC is connected with the ground layer 25 through a via hole 24a. The ground layer 25 is formed of conductors.

The capacitors 17a and 20a have a capacity of 0.001 $\mu$F or more, and are desirably components having a small parasitic inductance such as a surface-mounted type component.

The shape of the source line 19a may be designed in accordance with the following rules, and the effect of suppressing electromagnetic waves in accordance with the present invention can be attained by decreasing the input impedance.

A width (W) and a length (L) of the source line 19a are determined by a distance (h) between the source line 19a and the ground layer 25, a thickness (t) of the wiring, a dielectric constant ($\epsilon_r$) of the board and an upper limit frequency ($f_{max}$) at which the electromagnetic wave radiation may be suppressed under employment of glass epoxy resin having a dielectric constant of 4 as board material, The width (W) is so selected that the characteristic impedance Zp of the source line 19a is three times or more as large as the impedance |ZC1| of the capacitor 17a itself at the upper limit frequency ($f_{max}$) at which the electromagnetic wave radiation may be suppressed. The reason thereof is that the capacitor 17a may be utilized as a low impedance element to the source line by making Zp>|ZC1|X3.

The characteristic impedance Zp can be calculated by employing a distance (h) between a layer for mounting a source line, the signal layer 12 in this embodiment, and the ground layer 25, a dielectric constant ($\epsilon_r$) of the board material and a thickness (t) of the wiring and by applying these values to an equation for calculating the characteristic impedance of the wiring which is described in a publication (for example, Proceeding of the IEEE, Vol. 65, No. 11, November 1977, pp1611–1612). If it is assumed that glass epoxy resin having a dielectric constant of 4 is employed as board material, and the distance (h) is 0.2 mm, the thickness of the wiring is 12 $\mu$m, the maximum |ZC| is 8 ohm at 1 GHz currently attracting attention in connection with the electromagnetic wave radiation, the characteristic impedance Zp is designed to be 24 ohm or more. The width (W) is determined to be 1 mm or less by employing the equation in the above publication.

Figure 1:
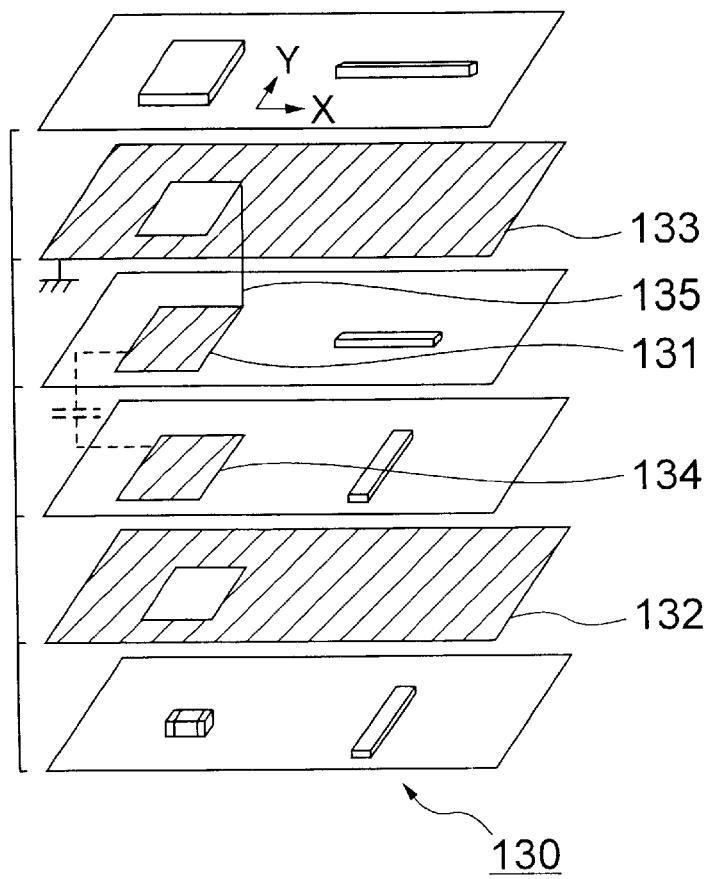
FIG. 1 is a broken perspective view of one example of a conventional printed circuit board.
Figure 2:
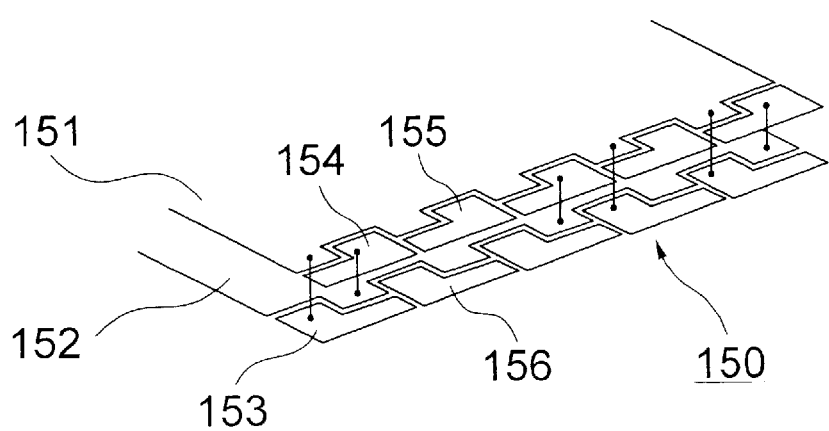
FIG. 2 is a partial perspective view of another example of a conventional printed circuit board.
Figure 3:
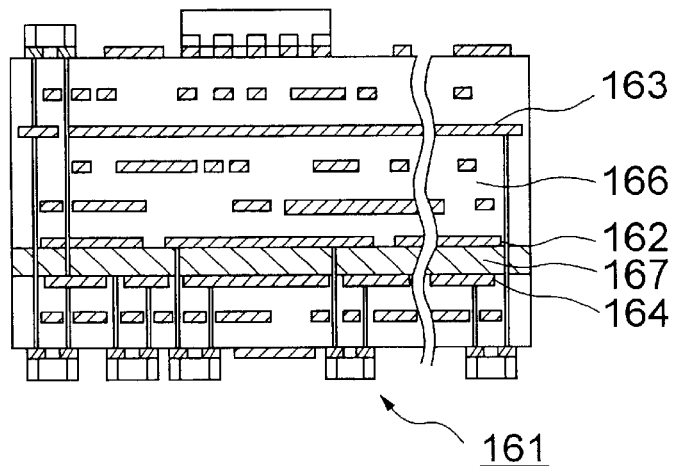
FIG. 3 is a cross sectional view of a further example of a conventional printed circuit board.
Figure 4:
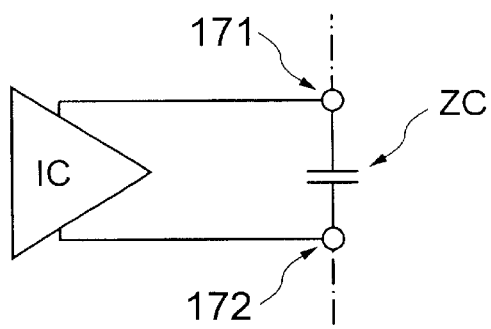
FIG. 4 is a circuit diagram illustrating a principle, of suppressing power source voltage variation of IC.
Figure 5:
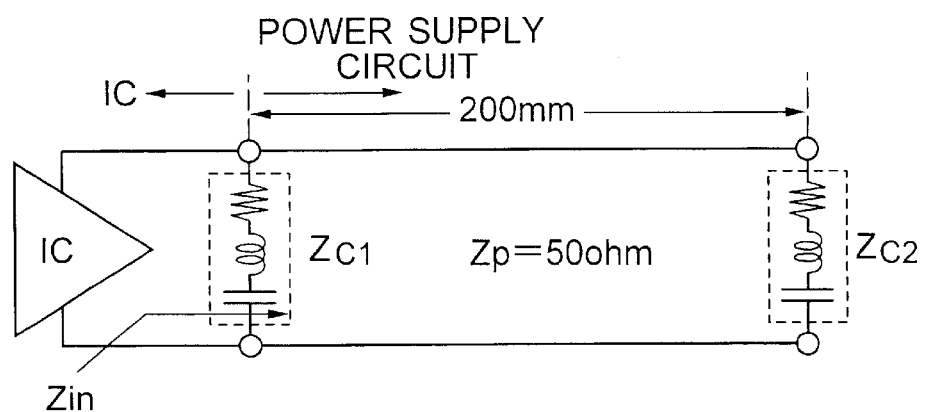
FIG. 5 is a circuit diagram, illustrating power source voltage variation of IC considering a source line.
Figure 6:
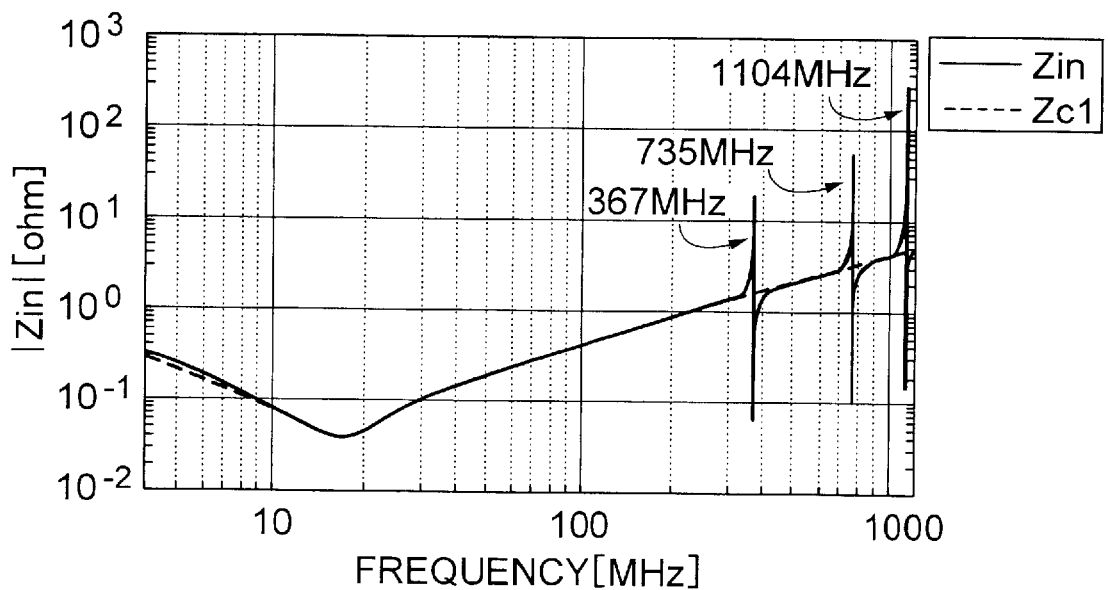
FIG. 6 is a graph showing input impedance characteristics seen from IC to the source line.
Figure 7:
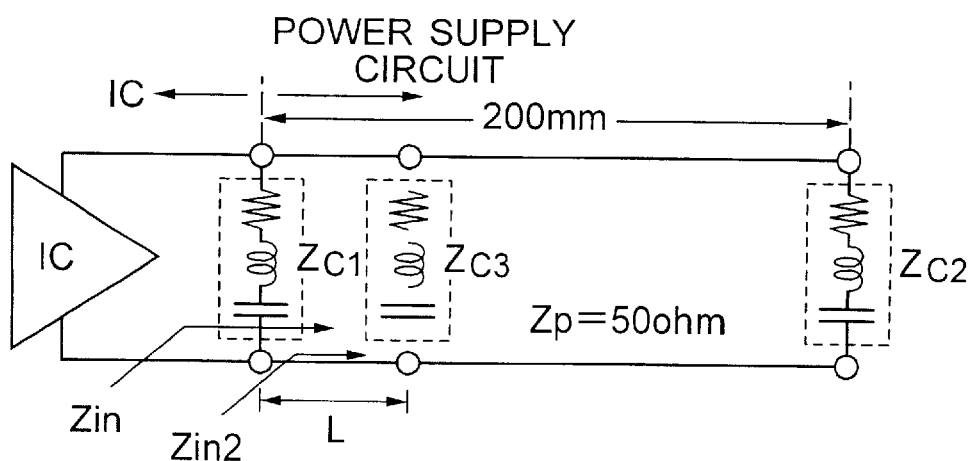
FIG. 7 is a circuit diagram illustrating an effect of the present invention.
Figure 8:
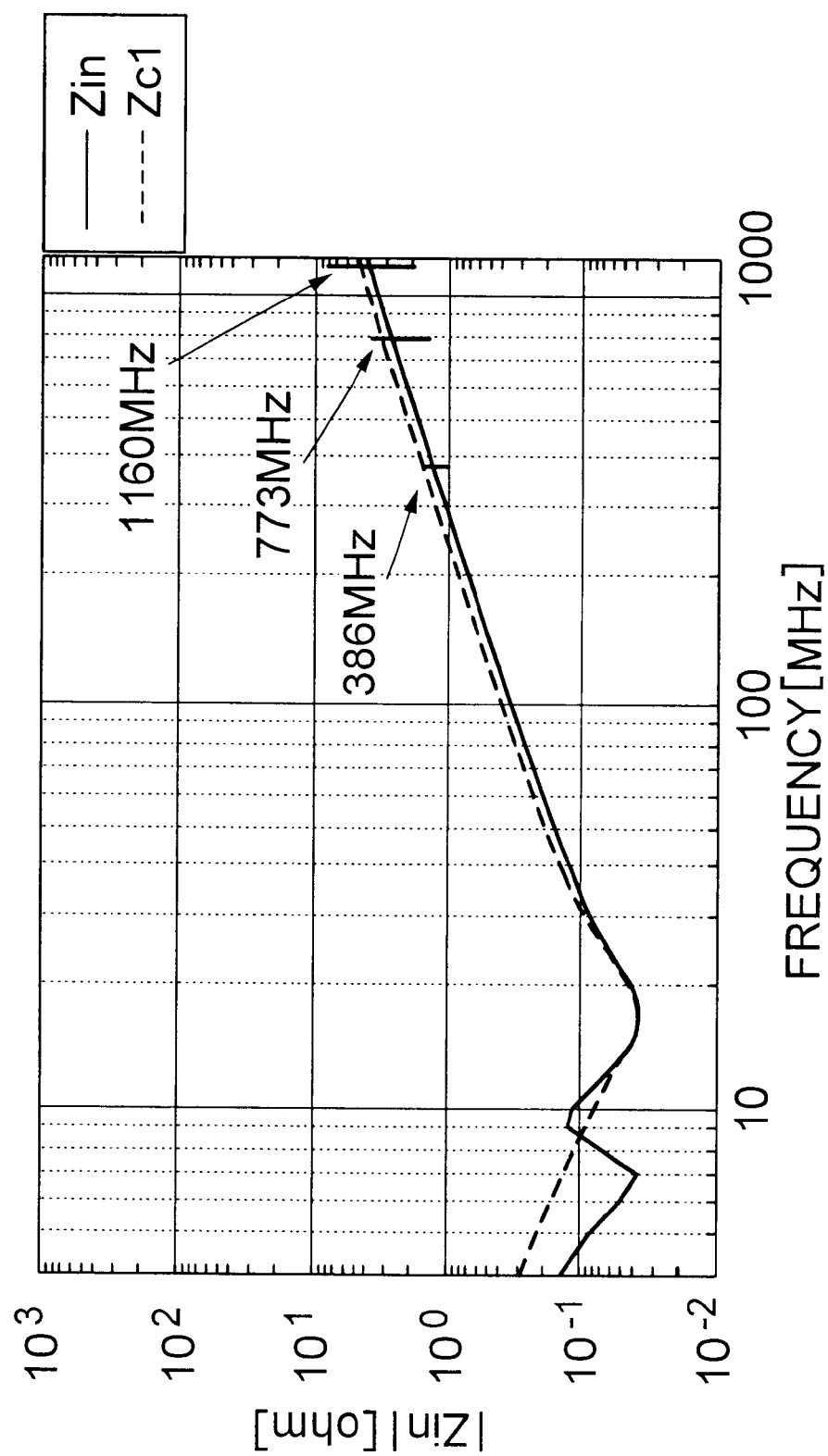
FIG. 8 is a graph showing input impedance characteristics when the present invention is applied.
Figure 9:
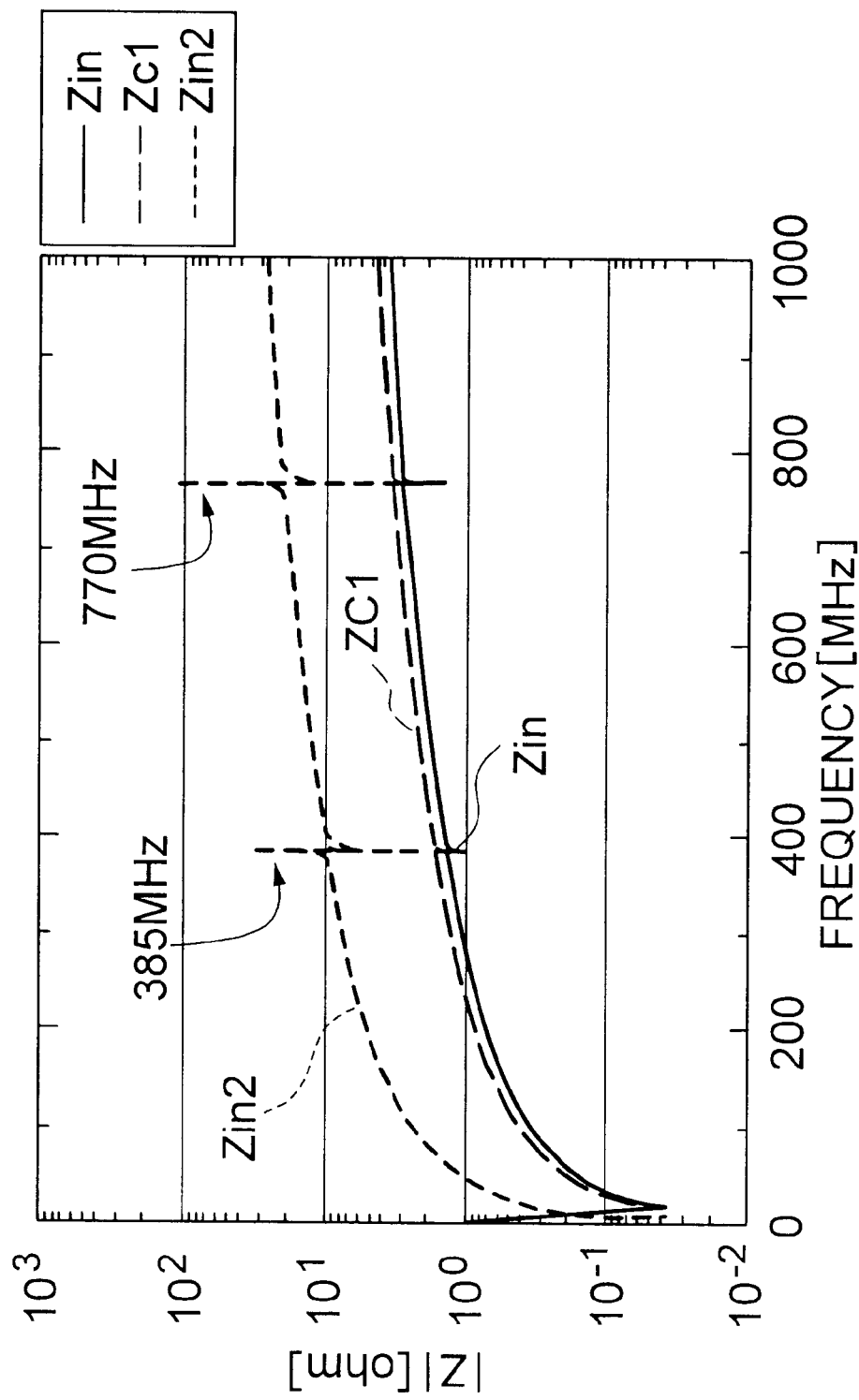
FIG. 9, is a graph showing another input impedance characteristics when the present invention is applied.
Figure 10:
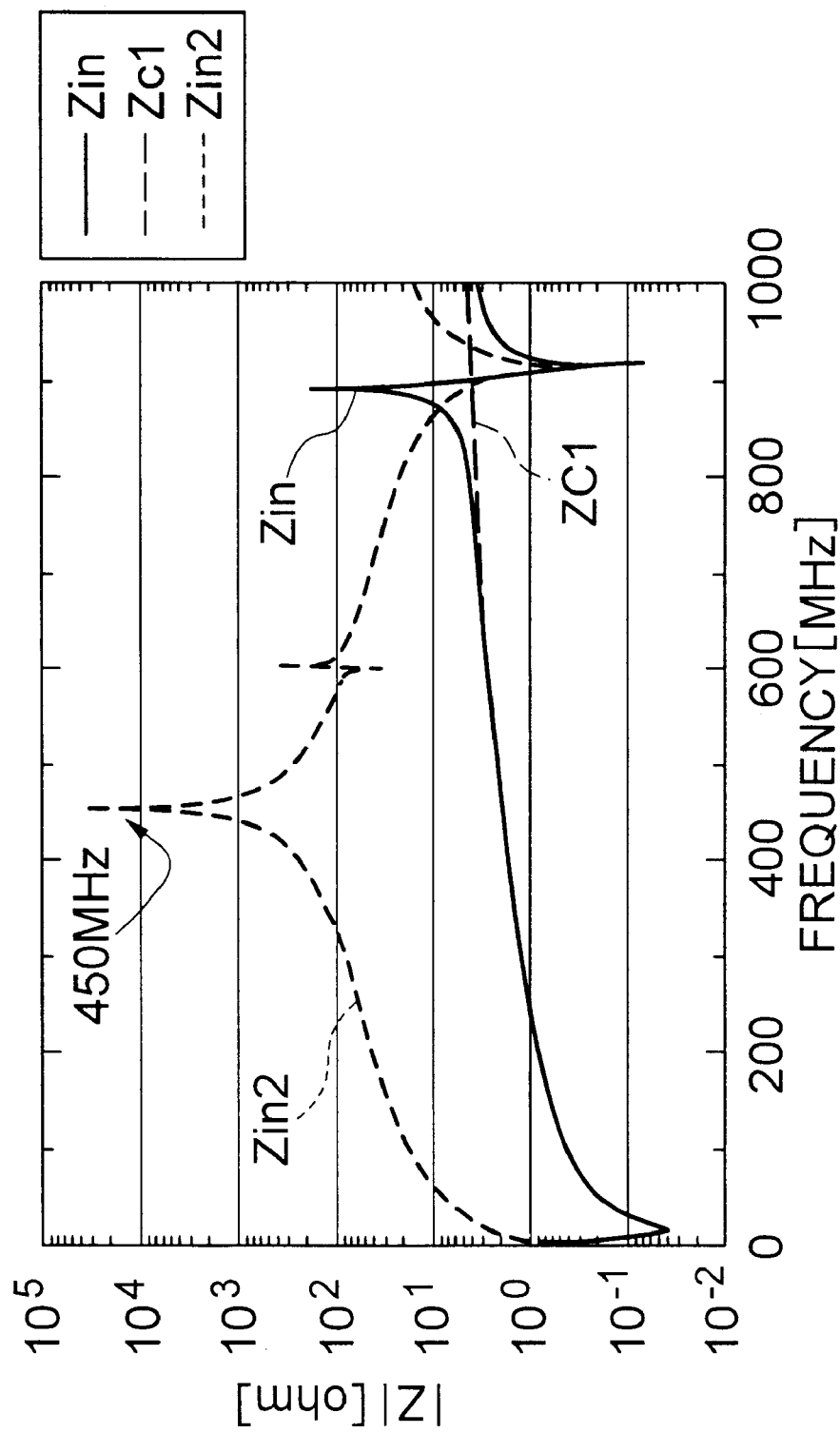
FIG. 10 is a graph showing further input impedance characteristics when the present invention is applied.

The length (L) of the source line 19a is determined by the minimum length ($L_{min}$) which makes the input impedance |Zin2| of the power supply circuit excluding this capacitor ZC1 sufficiently larger than the impedance |ZC1| of the capacitor mounted near the power supply terminal as shown in FIG. 9, and the maximum length ($L_{max}$) for not occurring the parallel resonance as shown in FIG. 10.

The minimum length ($L_{min}$) is made to be 10 mm from the results shown in FIG. 9 when the wavelength, reduction rate (the wavelength reduction rate is calculated to be 0.5 employing an equation of $1/\sqrt{\epsilon_r}$ if the dielectric constant ($\epsilon_r$) of the board material is 4) is 0.5. If the wavelength reduction rate is changed, the corrected value can be obtained by multiplying the wavelength reduction rate of the source line 19a by 20 mm to produce similar effects to those of FIG. 9.

On the other hand, the maximum length ($L_{max}$) is made to be one-fourth or less of the upper limit frequency ($f_{max}$) at which the electromagnetic wave radiation may be suppressed considering the wavelength reduction rate of the source line 19a. This maximum length ($L_{max}$) may be calculated because one-fourth of the wavelength at the frequency at which Zin2 is converted from an inductive reactance into a capacitive reactance equals to L=80 mm in the frequency characteristics in FIG. 10. When, for example, this upper limit frequency is 1 GHz and the wavelength reduction rate of the source line 19a is 0.5, the maximum length ($L_{max}$) is determined to be 37.5 mm.

Figure 14:
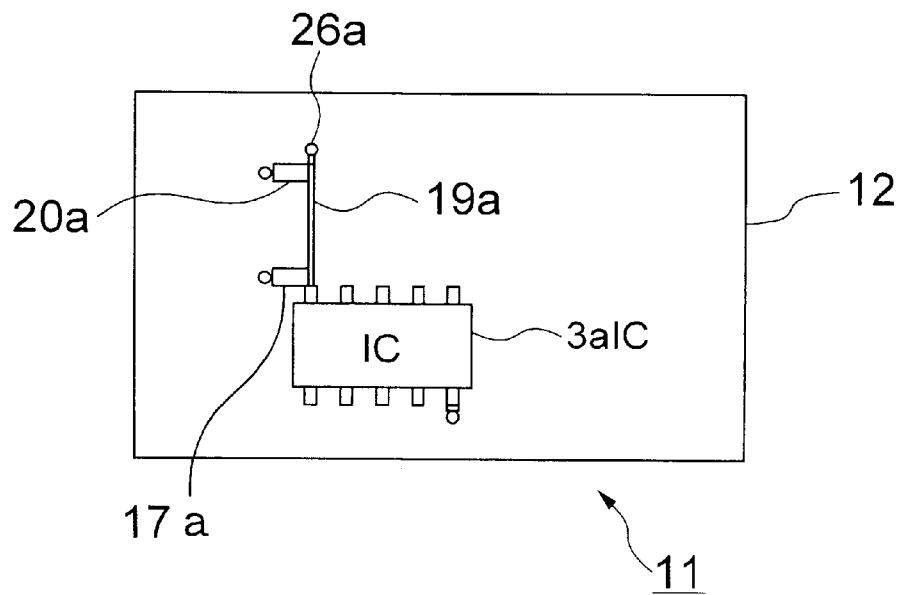
FIG. 14 is an enlarged view of the printed circuit board of the present invention around IC.
Figure 15:
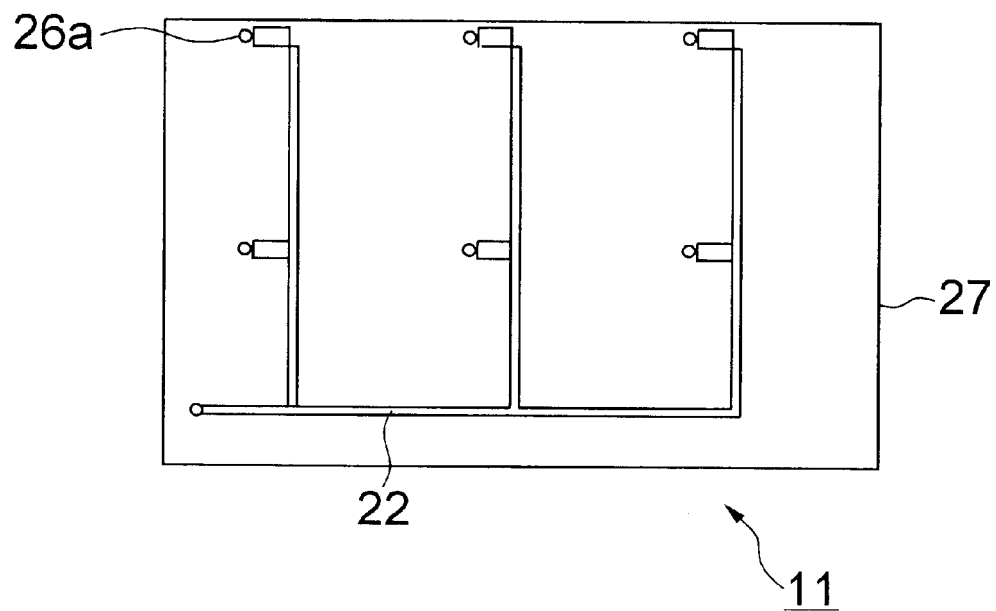
FIG. 15 is an elevational view of fine example of a power source layer of a printed circuit board of the present invention.
Figure 16:
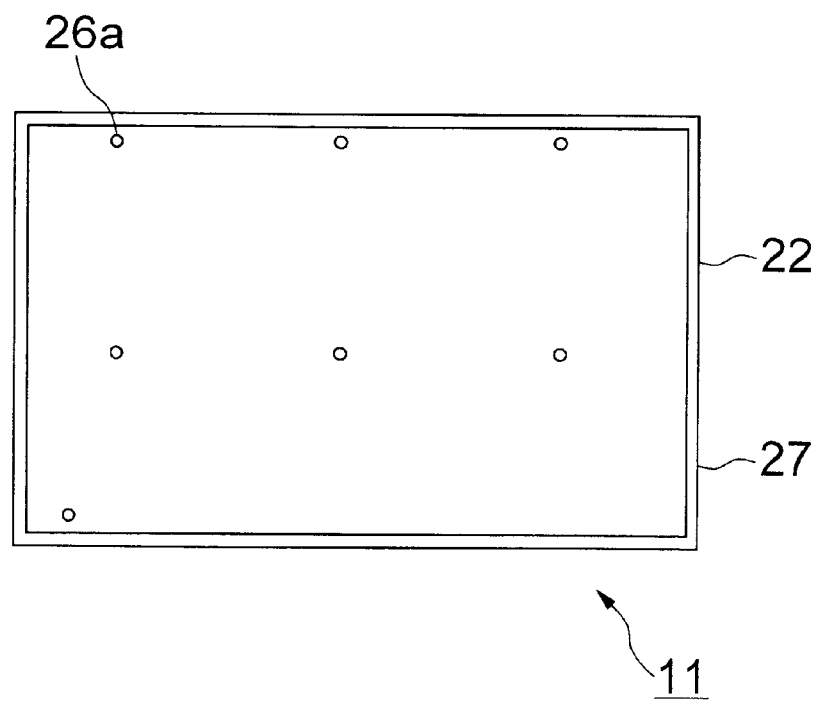
FIG. 16 is an elevational view of another example.

The way of mounting the common source line 22 is not especially restricted. The wiring 22 may be, for example, mounted on the signal layer 12 as a wiring having a width of 0.5 to 10 mm as shown in FIGS. 11 and 12. Or the wiring 22 may be located on a power source layer 27 separately arranged, and may be connected with the source line 19a and the capacitor 20a through the via hole as shown in FIGS. 14 and 15. The wiring 22 may be also a conductive plane covering the whole power source layer connected with the source line 19a and the capacitor 20a through the via hole 28 as shown in FIG. 16. However, the width of the wiring is preferably about 0.5 to 10 mm.

The capacitor 17a is preferably located on the same signal layer as that of IC to be connected. If the capacitor is connected to another layer, a via hole or the like must be employed, and a parasitic inductance of this via hole lowers the effects of the present invention.

Figure 17:
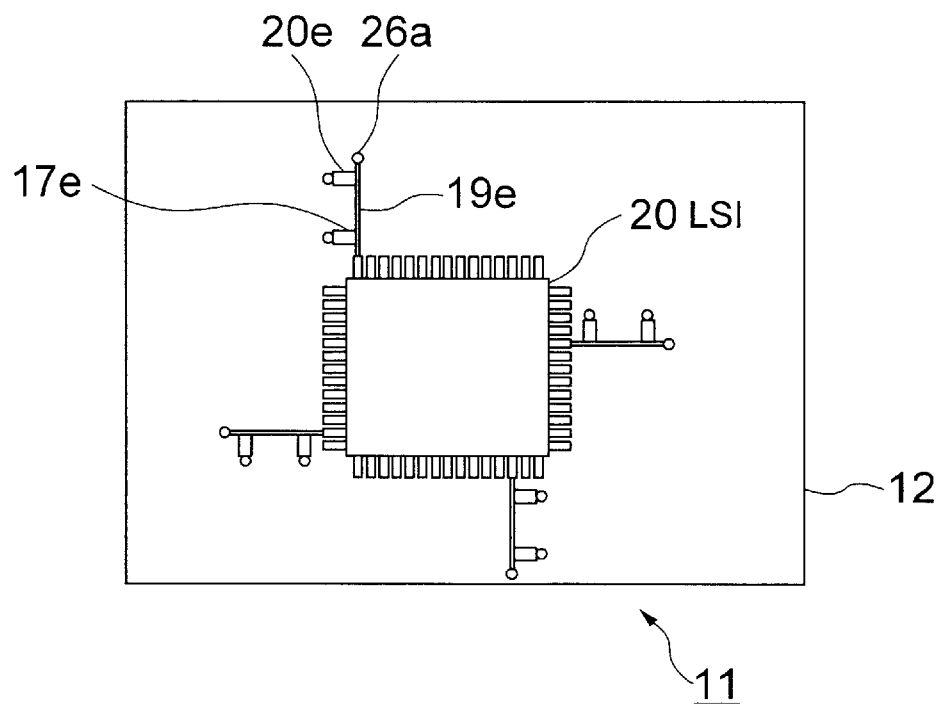
FIG. 17 is an enlarged view of a printed circuit board of the present invention around LSI.

A structure fox mounting LSI20 having a plurality of power supply terminals is shown in FIG. 17. The capacitor 17e and the source line 19e are connected with the respective power supply terminals, and the power source layer having the common source line 22 is connected to the other end of the source line 19e through the capacitor 20e and a via hole 26a. As mentioned earlier, the capacitor 17e is mounted on the same signal layer 12 of 20LSI. The source line 19e, the capacitor 20e and the common source line are not necessarily mounted on the signal layer 12, and may be mounted on another layer.

Embodiment 2

Figure 18:
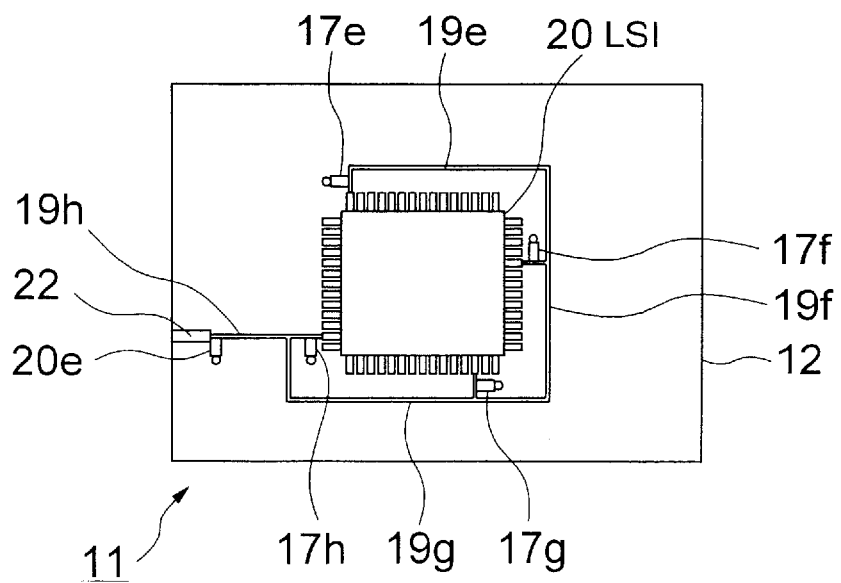
FIG. 18 is an enlarged view showing one example of a second embodiment of a printed circuit board in accordance with the present invention around LSI.

FIG. 18 shows a second embodiment of a printed circuit board in accordance with the present invention. In this embodiment, the description of the same elements as those of the first embodiment will be omitted by affixing the same numerals thereto.

This mounting structure is characterized by the reduction of the number of capacitors by jointly sharing the capacitor 17e mounted near the adjacent power supply terminals in place of employing the capacitor 20e shown in FIG. 17. A capacitor 17f shown in FIG. 18 is employed to have the same function as that of the capacitor 20e in FIG. 17. The width and the length of the source line between adjacent capacitors, more in concrete, those of the source line 19e, 19f, 19g and 19h between the capacitors 17e and 17f, between the capacitors 17f and 17g, between the capacitors 17g and 17h and between the capacitors 17h and 20e, respectively, are determined in accordance with the above method of designing the width (W) and the length (L) of the source line 19a mentioned earlier.

Figure 19:
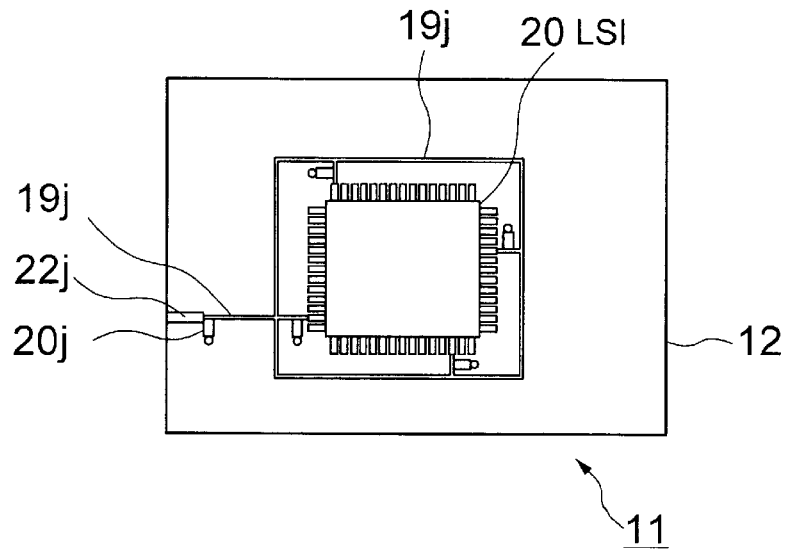
FIG. 19 is an enlarged view showing another example of a second embodiment.

In this second embodiment, as shown in FIG. 19, the source line 19j may be present all around 20LSI, and the source line 19j and the capacitor 20j are connected to the source line 19j which is then connected to the common source line 22j.

Although one LSI having a plurality of the power supply terminals is mounted in this case, one or more capacitors may be jointly owned among a plurality of ICs and LSIs when these are mounted. In this instance, a width (W) and a length (L) of a source line between adjacent capacitors may be determined in accordance with the above method.

When LSI having a built-in capacitor is mounted, the built-in capacitor may be employed in place of the capacitor mounted near the power supply terminal. The source line designed in accordance with the above rule is connected to the power supply terminal, and the capacitor 20j and the common source line 22j are connected to the other end of the source line 19j.

The capacitor 20j may be replaced with a serial circuit including a capacitor and a resistor. Although even the printed circuit board of the present embodiment employing no resistors sufficiently suppresses the electromagnetic wave radiation, the parallel resonance occurring in the power supply circuit connected beyond the capacitor 20j can be suppressed if the replaced serial circuit including the resistor and the capacitor is employed.

The source line 19j is not necessarily mounted on the same signal layer as that of IC to which the source line 19j is connected, and it is provided on the power source layer. The structure thereof is not restricted to a linear one, and, for example, a meander-like structure may be employed. The employment of this structure can reduce a mounting space.

Examples of the present invention will be described.

Figure 20:
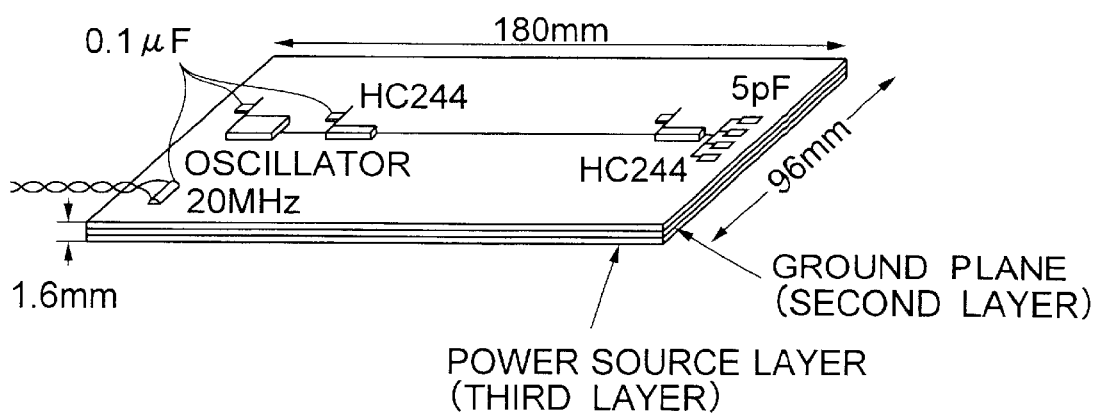
FIG. 20 is a perspective view of a printed circuit board illustrating Examples of the present invention.
Figure 21:
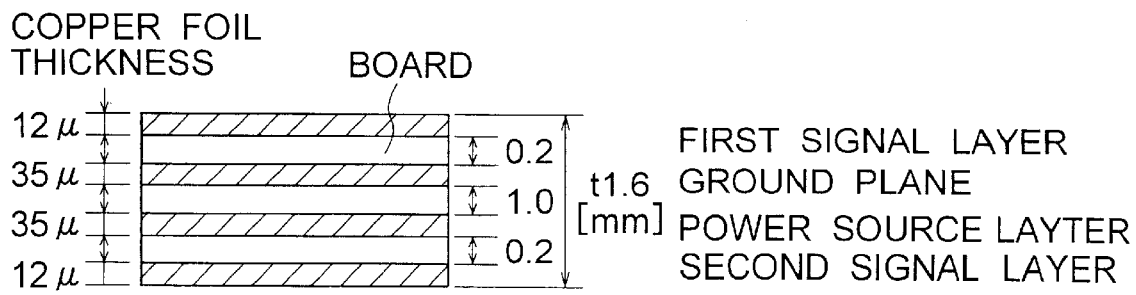
FIG. 21 is a sectional view of a printed circuit board illustrating Examples of the present invention.

An experiment for investigating the effects of the present invention employing a four-layered printed circuit board constituting a simple circuit was conducted. FIGS. 20 and 21 are a perspective view and a sectional view, respectively, of the printed circuit board employed in the experiment. The four layered structure consisted of a first signal layer, a ground layer, a power source layer and a second signal layer. Glass epoxy resin having a dielectric constant ($\epsilon_r$) of 4 was employed as board material. On the first signal layer, a circuit was constituted consisting of a quartz crystal oscillator of 20 MHz, IC for transmitting and receiving of HC244, a 5 pF capacitor for a terminal of the receiving IC, and a 0.1 $\mu$F capacitor located at a connection point among the quartz crystal oscillator, IC for transmitting and receiving and a power source cable. Both of the round layer and the power source layer were formed by a conductive plane covering the whole board. No wiring and no mounting were made on the second signal layer.

Figure 22A:
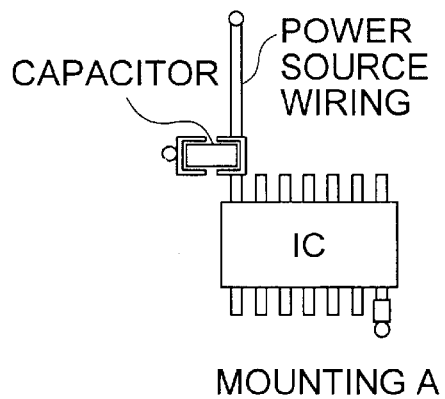
FIGS. 22A to 22C are vertical elevational views illustrating ways of mounting.
Figure 22B:
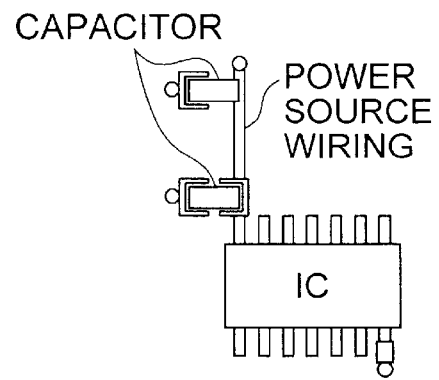
Figure 22C:
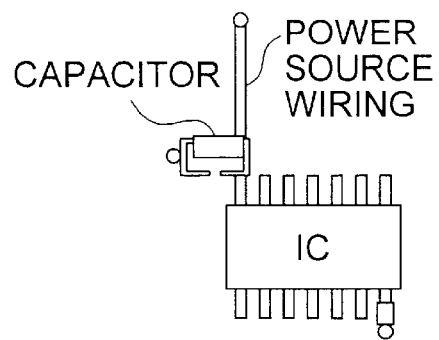

In FIGS. 22A to 22C, ways of mounting a capacitor with a quartz crystal oscillator and IC for transmitting and receiving are illustrated. The way illustrated in FIG. 22A is a conventional mounting method in which a 0.1 $\mu$F capacitor is mounted on an IC power supply terminal. The width of the source line of the first signal layer was 1 mm, and its characteristic impedance was about 30 ohm. The mounting of FIG. 22B is obtained by applying the present embodiment in which two 0.1 $\mu$F capacitors were employed and a length of a source line between the capacitors was made to be 10 mm. This value was obtained by multiplying 20 mm by the wavelength reduction rate ($1/\sqrt{\epsilon_r}$=0.5) based on the above mentioned design rule. FIG. 22C shows another example of mounting in which two capacitors are piled on each other, or a length (L) of a source line is 0 mm.

Figure 23:
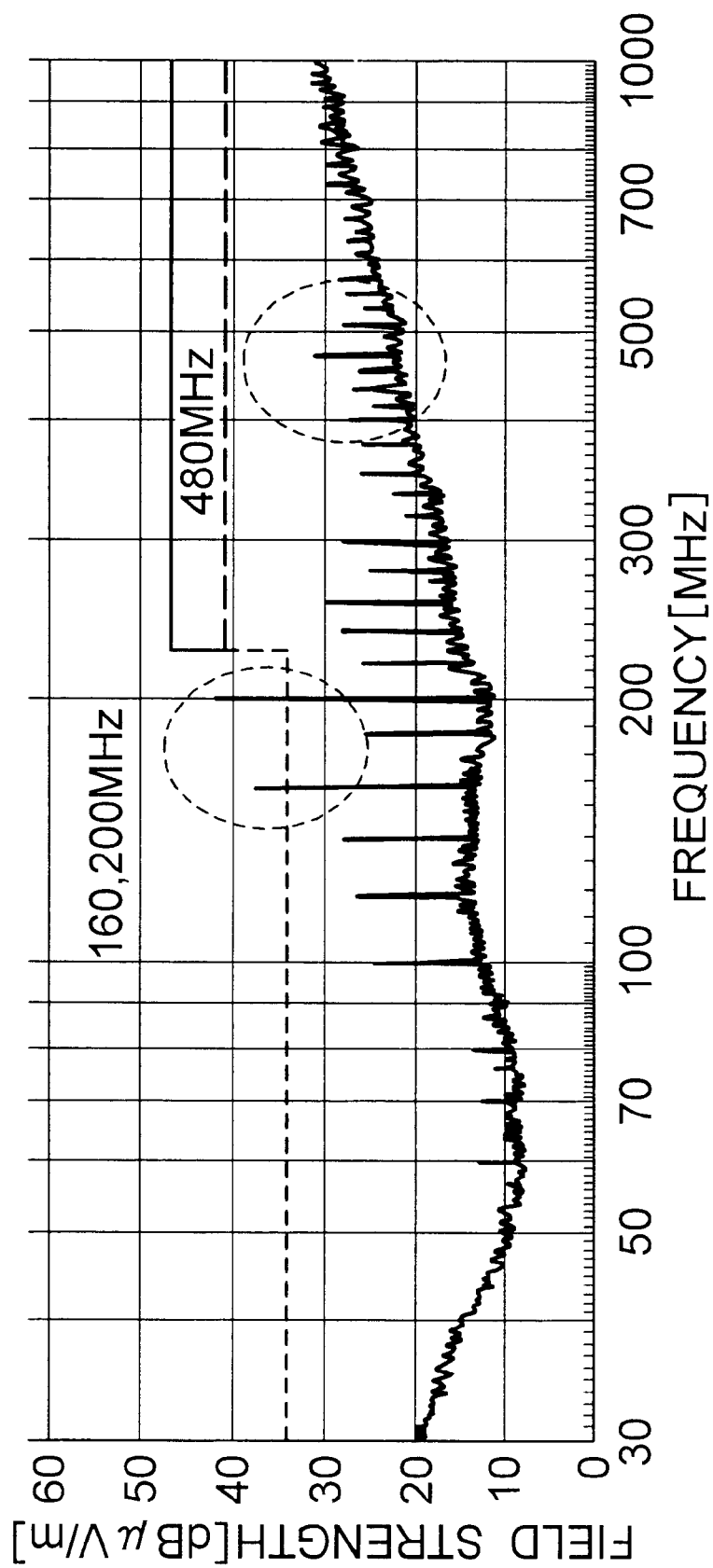
FIG. 23 is a graph showing radiation field characteristics of the mounting A of FIG. 22A.
Figure 24:
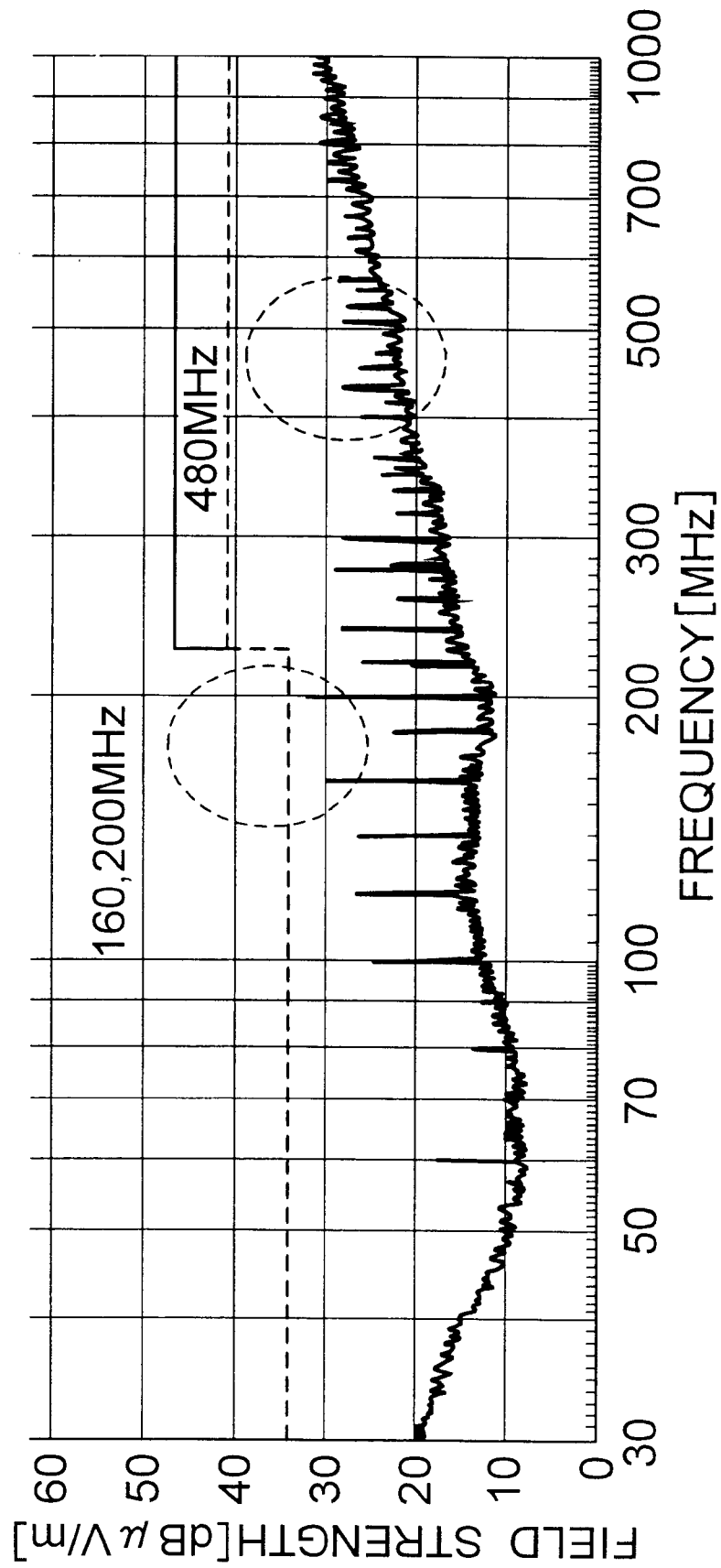
FIG. 24 is a graph showing radiation field characteristics of the mounting B of FIG. 22B.
Figure 25:
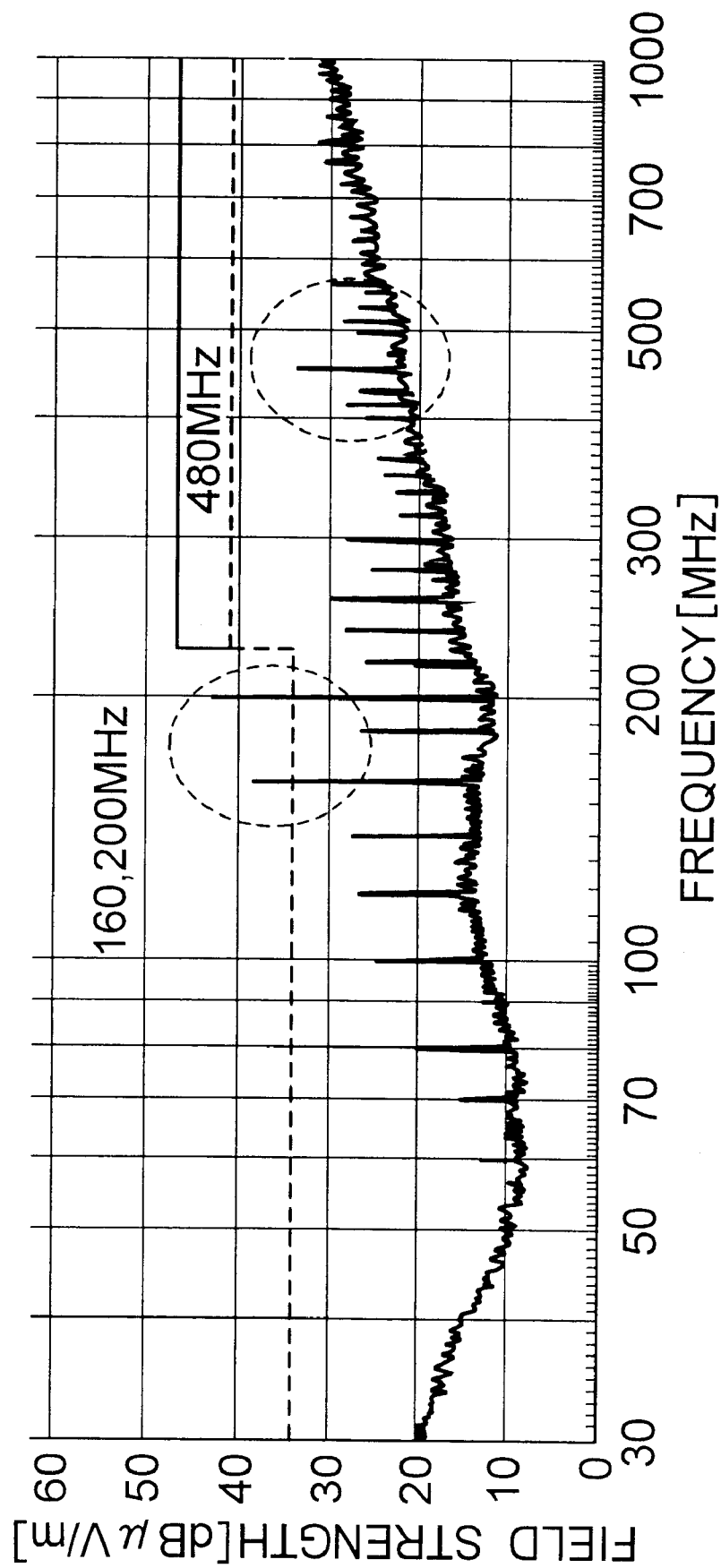
FIG. 25 is a graph showing radiation field characteristics of the mounting C of FIG. 22C.

FIGS. 23 to 25 show the respective radiation field characteristics of the mountings of FIGS. 22A, 22B and 22C, respectively when the measurement was conducted at a place three meters from the device. Although horizontally polarized wave components and vertical polarized plane wave components of the radiation field characteristics were measured, only the horizontally polarized wave components were shown, because the both components exhibited nearly the same frequency characteristics. When the mounting A is compared with the mounting B, the radiation level of the mounting A is 160 MHz, 200 MHz and 480 MHz which are higher than those of the mounting B. The mounting C and the mounting A exhibited nearly the same characteristics. From these results, it can be confirmed that the present invention has an effect of suppressing the electromagnetic wave radiation from the printed circuit board.

Since the above embodiments are described only for examples, the present invention is not limited to the above embodiments and various modifications or alternations can be easily made therefrom by those skilled in the art without departing from the scope of the present invention.

What is claimed is:

1. A printed circuit board, comprising:

at least one ground layer;

at least one signal layer mounting thereon a plurality of active elements each implementing an integrated circuit having at least one power supply terminal;

a common power source line;

a plurality of first source lines each disposed for a corresponding one of said active elements, each of said first source lines having a first terminal connected to said power supply terminal of a corresponding one of said active elements and a second terminal connected to said common source line;

a first capacitor having a first impedance at a specified frequency specified as an upper limit of a controlled frequency band and connected between said first terminal and said ground layer; and a second capacitor having a second impedance at said specified frequency and connected between said second terminal and said ground layer, each of said first source lines having at said specified frequency a characteristic impedance, which is not lower than three times said first impedance and said second impedance.

2. The printed circuit board as defined in claim 1, wherein said at least one power supply terminal includes a plurality of power supply terminals connected via a second source line, and each of said power supply terminals is associated with a corresponding one of said first capacitor.

3. The printed circuit board as defined in claim 1, wherein said common power source line has a characteristic impedance, which is not lower than three times said first impedance and said second impedance.

4. The printed circuit board as defined in claim 1, wherein said first source line has a length which is between 20 mm×1 /$\epsilon_r^{1/2}$ and a length based on $f_{max} \times \epsilon_r^{1/2}/4$, wherein $\epsilon_r$ is a wavelength reduction ratio and $f_{max}$ is said specified frequency.

5. The printed circuit board as defined in claim 1, wherein said at least one signal layer includes a plurality of signal layers and said first capacitor is mounted on one of said signal layers mounting thereon a corresponding active element.

6. The printed circuit board as defined in claim 1, wherein said second capacitor is associated with a serial resistor.

7. The printed circuit board as defined in claim 1, wherein said at least one power supply terminal includes a plurality of power supply terminals, each connected to said first terminal of a corresponding one of said first source lines.

* * * * *